(12) United States Patent
White et al.

(10) Patent No.: US 9,425,769 B1
(45) Date of Patent: Aug. 23, 2016

(54) OPTICALLY POWERED AND CONTROLLED NON-FOSTER CIRCUIT

(71) Applicant: HRL LABORATORIES LLC., Malibu, CA (US)

(72) Inventors: Carson R. White, Agoura Hills, CA (US); James H. Schaffner, Chatsworth, CA (US)

(73) Assignee: HRL Laboratories, LLC, Malibu, CA (US)

( * ) Notice: Subject to any disclaimer, the term of this patent is extended or adjusted under 35 U.S.C. 154(b) by 103 days.

(21) Appl. No.: 14/335,737

(22) Filed: Jul. 18, 2014

(51) Int. Cl.
*H03H 11/44* (2006.01)
*H03H 11/28* (2006.01)

(52) U.S. Cl.
CPC ............... *H03H 11/44* (2013.01); *H03H 11/28* (2013.01)

(58) Field of Classification Search
CPC ............................... H03H 11/44; H03H 11/28
USPC ........................................................... 333/32
See application file for complete search history.

(56) References Cited

U.S. PATENT DOCUMENTS

| | | | |
|---|---|---|---|
| 4,234,960 A | 11/1980 | Spilsbury et al. | |
| 4,904,952 A | 2/1990 | Tanimoto | |
| 5,392,002 A | 2/1995 | Delano | |
| 5,489,878 A | 2/1996 | Gilbert | |
| 6,081,167 A | 6/2000 | Kromat | |
| 6,121,940 A | 9/2000 | Skahill et al. | |
| 6,411,261 B1 | 6/2002 | Lilly | |
| 6,476,771 B1 | 11/2002 | McKinzie, III | |
| 6,483,480 B1 | 11/2002 | Sievenpiper et al. | |
| 6,509,875 B1 | 1/2003 | Nair et al. | |
| 6,518,930 B2 | 2/2003 | Itoh et al. | |
| 6,525,695 B2 | 2/2003 | McKinzie | |
| 6,538,621 B1 | 3/2003 | Sievenpiper et al. | |
| 6,768,472 B2 | 7/2004 | Alexopoulos et al. | |
| 6,917,343 B2 | 7/2005 | Sanchez et al. | |
| 6,952,565 B1 | 10/2005 | Takeda et al. | |
| 7,042,419 B2 | 5/2006 | Werner et al. | |
| 7,245,269 B2 | 7/2007 | Sievenpiper et al. | |
| 7,388,186 B2 * | 6/2008 | Berg | H01H 1/0036 250/214 LS |
| 7,586,384 B2 | 9/2009 | Ranta | |
| 7,619,568 B2 | 11/2009 | Gillette | |

(Continued)

FOREIGN PATENT DOCUMENTS

| | | |
|---|---|---|
| CN | 101853974 A | 10/2010 |
| CN | 102005648 A | 4/2011 |

(Continued)

OTHER PUBLICATIONS

From U.S. Appl. No. 14/188,225 (Now Published as 2015/0244080), Non-Final Rejection mailed on Nov. 3, 2015.

(Continued)

*Primary Examiner* — Stephen E Jones
*Assistant Examiner* — Scott S Outten
(74) *Attorney, Agent, or Firm* — Ladas & Parry

(57) ABSTRACT

This invention is the Optically Powered and Controlled Non-Foster Circuit (OPCNFC) that is electrically floating; i.e., it does not have any metallic electrical/conductive connection to a power supply, ground, or control signal. Rather power and control signals are applied to the OPCNFC using optical energy. The Non-Foster Circuit (NFC) synthesizes negative inductance, negative capacitance, and/or negative resistance between metallic patches disposed in an array of an Artificial Impedance Surface (AIS).

20 Claims, 5 Drawing Sheets

(56) References Cited

U.S. PATENT DOCUMENTS

| | | | |
|---|---|---|---|
| 7,847,633 | B2 | 12/2010 | Kinget |
| 7,852,174 | B2 | 12/2010 | Cathelin et al. |
| 7,880,568 | B2 | 2/2011 | Amin et al. |
| 7,941,022 | B1 | 5/2011 | Schaffner et al. |
| 8,111,111 | B2 | 2/2012 | Van Bezooijen |
| 8,263,939 | B2 | 9/2012 | Delaney et al. |
| 8,358,989 | B2 | 1/2013 | Kakuya et al. |
| 8,374,561 | B2 | 2/2013 | Yung et al. |
| 8,436,785 | B1 | 5/2013 | Lai et al. |
| 8,451,189 | B1 | 5/2013 | Fluhler |
| 8,639,203 | B2 | 1/2014 | Robert et al. |
| 8,957,831 | B1 | 2/2015 | Gregoire et al. |
| 8,959,831 | B2 | 2/2015 | Smith |
| 8,976,077 | B2 | 3/2015 | Colburn et al. |
| 8,988,173 | B2 | 3/2015 | Hitko et al. |
| 9,093,753 | B2 | 7/2015 | Jung et al. |
| 2002/0041205 | A1 | 4/2002 | Oppelt |
| 2002/0167457 | A1 | 11/2002 | McKinzie et al. |
| 2004/0056814 | A1 | 3/2004 | Park et al. |
| 2004/0227668 | A1 | 11/2004 | Sievenpiper |
| 2004/0263420 | A1 | 12/2004 | Werner et al. |
| 2005/0184922 | A1 | 8/2005 | Ida et al. |
| 2007/0182639 | A1 | 8/2007 | Sievenpiper et al. |
| 2008/0088390 | A1 | 4/2008 | Cathelin et al. |
| 2008/0094300 | A1 | 4/2008 | Lee |
| 2008/0164955 | A1 | 7/2008 | Pfeiffer et al. |
| 2008/0242237 | A1 | 10/2008 | Rofougaran et al. |
| 2008/0284674 | A1 | 11/2008 | Herz et al. |
| 2009/0025973 | A1 | 1/2009 | Kazantsev et al. |
| 2010/0039111 | A1 | 2/2010 | Luekeke et al. |
| 2010/0039343 | A1 | 2/2010 | Uno et al. |
| 2010/0149430 | A1 | 6/2010 | Fulga et al. |
| 2010/0225395 | A1 | 9/2010 | Patterson |
| 2010/0231470 | A1 | 9/2010 | Lee et al. |
| 2010/0238085 | A1 | 9/2010 | Fuh et al. |
| 2011/0018649 | A1 | 1/2011 | David et al. |
| 2013/0009720 | A1 | 1/2013 | White et al. |
| 2013/0009722 | A1 | 1/2013 | White et al. |
| 2013/0200947 | A1 | 8/2013 | Alexopoulos et al. |
| 2015/0244080 | A1 | 8/2015 | Gregoire et al. |

FOREIGN PATENT DOCUMENTS

| | | |
|---|---|---|
| EP | 0295704 A2 | 12/1988 |
| EP | 2290745 A1 | 3/2011 |
| GB | 2288502 A | 10/1995 |
| JP | 2008 278159 A | 11/2008 |
| TW | 200845482 | 11/2008 |
| WO | 2006/054246 | 5/2006 |
| WO | 2009/090244 A1 | 7/2009 |

OTHER PUBLICATIONS

From U.S. Appl. No. 14/856,541 (filed on Sep. 16, 2015; unpublished; non publication request filed), Application and Office Actions.
From U.S. Appl. No. 13/472,396 (now published as US 2013-0009722 A1), Office Action dated Sep. 11, 2015.
Office Action from Chinese Patent Application No. 201280021449.5 dated Sep. 29, 2015 with brief English summary.
U.S. Appl. No. 14/856,541, filed Sep. 16, 2015, Gregoire.
U.S. Appl. No. 13/910,039, filed Jun. 4, 2013, Gregoire et al.
U.S. Appl. No. 14/188,225, filed Feb. 24, 2014, Gregoire et al.
U.S. Appl. No. 14/188,264, filed Feb. 24, 2014, White et al.
U.S. Appl. No. 14/628,076, filed Feb. 20, 2015, White et al.
Adonin, A.S., K. o. Petrosjanc, I. V. Poljakov, "Monolith Optoelectronic Integrated Circuit With Built-In Photovoltaic Supply for Control and Monitoring," 1998 IEEE International Conference on Electronics, Circuits and Systems, vol. 2, pp. 529-531, (1998).
Bezooijen, et al. "RF-MEMS based adaptive antenna matching module," IEEE Radio Frequency Integrated Circuits Symposium, p. 573-576, 2007.
Brennan, et al., "The CMOS negative impedance converter", *IEEE Journal of Solid-State Circuits*, 32(5), Oct. 1988.
Chen, Ying et al., "Wideband Varactorless LC VCO Using a Tunable Negative-Inductance Cell", IEEE Transactions on Circuits and Systems, I: Regular Papers, IEEE, US, vol. 57, No. 10, Oct. 1, 2010, pp. 2609-2617 and II. A Principle of Tunable NI Cell, p. 2609.
Chinese Office Action dated Dec. 2, 2014 from Chinese Patent Application No. 201280021746 with English summary.
Chinese Office Action dated Oct. 27, 2014 from Chinese Patent Application No. 2012800334482 with English translation.
Colburn, J.S., et al., "Adaptive Artificial Impedance Surface Conformal Antennas", *Proc. IEEE Antennas and Propagation Society Int. Symp.*, 2009, pp. 1-4.
Costa, F. et al., "On the bandwidth of high-impedance frequency selective surfaces", IEEE AWPL, vol. 8, pp. 1341-1344, 2009.
Cyril Svetoslavov Mechkov, "A heuristic approach to teaching negative resistance phenomenon," *Third International Conference—Computer Science '06*, Istanbul, Turkey, Oct. 12-15, 2006 (6 pgs).
EPO Extended Search Report with Search Opinion dated Mar. 19, 2015 from European Patent Application No. 12806913.5.
EPO Supplementary European Search Report with European Search Opinion dated Jul. 29, 2014 from European Patent Application No. 12767559.3.
EPO Supplementary European Search Report with European Search Opinion dated Oct. 8, 2014 from European Patent Application No. 12768357.1.
Fong, B.H., et al., "Scalar and tensor holographic artificial impedance surfaces", *Trans. Antennas and Propag.*, vol. 58, pp. 3212-3221, Oct. 2010.
Foster, R. M. "A reactance theorem", Bell Systems Technical Journal, vol. 3, pp. 259-267, 1924.
From U.S. Appl. No. 13/910,039 (unpublished, non publication requested), Office Action mailed on Jun. 15, 2015.
From U.S. Appl. No. 12/768,563 (now U.S. Pat. No. 8,374,561), Notice of Allowance mailed on Oct. 9, 2012.
From U.S. Appl. No. 12/768,563 (now U.S. Pat. No. 8,374,561), Non-Final Office Action mailed on Jun. 13, 2012.
From U.S. Appl. No. 12/768,563 (now U.S. Pat. No. 8,374,561), Notice of Allowance mailed on Oct. 23, 2012.
From U.S. Appl. No. 13/177,479 (now U. S. Publication No. 2013-0009720 A1), Non-Final Office Action mailed on Dec. 2, 2014.
From U.S. Appl. No. 13/177,479 (now U. S. Publication No. 2013-0009720 A1), Non-Final Office Action mailed on Jun. 4, 2014.
From U.S. Appl. No. 13/441,659 (now U. S. Publication No. 2012-0256811 A1), Final Office Action mailed on Jul. 1, 2014.
From U.S. Appl. No. 13/441,659 (now U. S. Publication No. 2012-0256811 A1), Non-Final Office Action mailed on Feb. 24, 2014.
From U.S. Appl. No. 13/441,659 (now U. S. Publication No. 2012-0256811 A1), Notice of Allowance mailed on Oct. 30, 2014.
From U.S. Appl. No. 13/441,730 (now U. S. Publication No. 2012-0256709 A1), Non-Final Office Action mailed on Mar. 13, 2014.
From U.S. Appl. No. 13/441,730 (now U. S. Publication No. 2012-0256709 A1), Notice of Allowance mailed on Jul. 28, 2014.
From U.S. Appl. No. 13/441,730 (now U. S. Publication No. 2012-0256709 A1), Notice of Allowance mailed on Nov. 10, 2014.
From U.S. Appl. No. 13/472,396 (now U. S. Publication No. 2013-0009722 A1), Final Office Action mailed on Apr. 9, 2015.
From U.S. Appl. No. 13/472,396 (now U. S. Publication No. 2013-0009722 A1), Non-Final Office Action mailed on Dec. 2, 2014.
From U.S. Appl. No. 13/472,396 (now U. S. Publication No. 2013-0009722 A1), Non-Final Office Action mailed on Jul. 30, 2014.
From U.S. Appl. No. 14/188,225, filed Feb. 24, 2014; unpublished), Application and Office Actions.
From U.S. Appl. No. 14/188,264, filed Feb. 24, 2014; unpublished), Application and Office Actions.
From U.S. Appl. No. 14/628,076, filed Feb. 20, 2015; unpublished), Application and Office Actions.
Gower, John, Optical Communications Systems, 2nd edition, Prentice Hall, 1993, pp. 40-46.
Gregoire, D. J.; Colburn, J. S.; White, C. R.; , "A coaxial TEM cell for direct measurement of UHF artificial magnetic conductors", IEEE Antenna and Propagation Magazine, 54, 251-290, 2012.
Gregoire, D.J. et al. "Non-foster metamaterials", *Antenna Applications Symposium 2011*, Sep. 2011.

(56) References Cited

OTHER PUBLICATIONS

Gregoire, Daniel J., et al., "Wideband Artificial Magnetic Conductors Loaded With Non-Foster Negative Inductors", IEEE Antennas and Wireless Propagation Letters, IEEE, Piscataway, NJ, US, vol. 10, Dec. 26, 2011, pp. 1586-1589.
Hrabar S., et al., "Towards active dispersion less ENZ metamaterial for cloaking applications", Metamaterials, Elsevier BV, NL, vol. 4, No. 2-3, Aug. 1, 2010, pp. 89-97.
International Preliminary Report on Patentability for PCT/US2012/032648 mailed on Oct. 17, 2013.
International Preliminary Report on Patentability for PCT/US2012/045632 mailed on Jul. 10, 2013.
International Preliminary Report on Patentability for PCT/US2012/32638 mailed on Jun. 27, 2013.
International Search Report and Written Opinion for PCT/US/2012/032638 mailed on Oct. 29, 2012.
International Search Report and Written Opinion for PCT/US2012/032648 mailed on Dec. 14, 2012.
International Search Report and Written Opinion for PCT/US2012/045632 mailed on Jan. 10, 2013.
International Search Report and Written Opinion for PCT/US2014/072233 mailed on Mar. 16, 2015.
Kern D. J., et al., "Design of Reconfigurable Electromagnetic Bandgap Surfaces as Artificial Magnetic Conducting Ground Planes and Absorbers", Antennas and Propagation Society International Symposium 2006, IEEE Albuquerque, NM, USA Jul. 9-14, 2006, Piscataway, NJ, USA, IEEE, Piscataway, NJ, USA, Jul. 9, 2006, pp. 197-200.
Kern, D.J. et al., "Active negative impedance loaded EBG structures for the realization of ultra-wideband artificial magnetic conductor", *Proc. IEEE Antennas and Propagation Society Int. Symp.*, 2003, pp. 427-430.
Linvill, J.G. "Transistor negative-impedance converters", *Proceedings of the IRE*, vol. 41, pp. 725-729, Jun. 1953.
Luukkonen, O. et al, "Simple and accurate analytical model of planar grids and high-impedance surfaces", IEEE Trans. Antennas Propagation, vol. 56, 1624, 2008.
Mirzaei, H, et al.: "A wideband metamaterial-inspired compact antenna using embedded non-Foster matching," Antennas and Propagation (APSURSI), 2011 IEEE International Symposium on, IEEE. Jul. 3, 2011, pp. 1950-1953.
Office Action dated Jun. 8, 2015 from Chinese Patent Application No. 201280033448.2 with machine English translation.
Pozar, David M., *Microwave Engineering*, Second Edition, John Wiley & Sons, Inc., 1998, pp. 89-90 and 629-631 with table of contents (16 pages).
Ramirez-Angulo, J. et al.: "Simple technique using local CMFB to enhance slew rate and bandwidth of one-stage CMOS op-amps", Electronics Letters, IEE Stevenage, GB, vol., 38, No. 23, Nov. 7, 2002, pp. 1409-1411.

Sandel, B., Radio Frequency Amplifiers, A.S.T.C., Chapter 23, pp. 912-946, 1960.
Sievenpiper, D. et al., "High-impedance electromagnetic surfaces with a forbidden frequency band," IEEE Trans. Microwave Theory Tech., vol. 47, pp. 2059-2074, Nov. 1999.
Song, K. and Rojas, R.G., "Non-foster impedance matching of electrically small antennas," *Proc. IEEE Ant. Prop. Int. Symp.*, Jul. 2010.
Staple, et al. "The End of Spectrum Scarcity," published by IEEE Spectrum, Mar. 2004, pp. 1-5.
Stearns, S. "Non-Foster circuits and stability theory," *Proceedings IEEE Antennas and Proagation Int.* Symposium, 2011, pp. 1942-1945.
Sussman-Fort, S. E. "Gyrator-Based Biquad Filters and Negative Impedance Converters for Microwaves," *International Journal of RF and Microwave Computer-Aided Engineering*, vol. 8 (2): pp. 86-101, 1998.
Sussman-Fort, S.E. "Matching Network Design Using Non-Foster Impedances," *International Journal of RF and Microwave Computer-Aided Engineering*, vol. 16, Issue 2, pp. 135-142, Feb. 2006.
Sussman-Fort, S.E. and R. M, Rudish, "Non-Foster Impedance Matching of Electrically Small Antennas, IEEE Trans. Antennas and Propagation," vol. 57, No. 8, pp. 2230-2241, (Aug. 2009).
Sussman-Fort, S.E. and R.M. Rudish. EDO Corporation, "Increasing efficiency or bandwidth of electrically small transmit antennas by impedance matching with non-foster circuits", Progress in Electromagnetics Research Symposium 2006, Cambridge, USA, Mar. 26-29, 2006 (23 pages).
Sussman-Fort, S.E., Ph.D, Slideshow for "Matching Network Design Using Non-Foster Impedances" EDO Corporation (printed from the Internet on Jun. 30, 2011) (43 pages).
Sussman, S.E. and Rudish, R.M., "Non-Foster Impedance matching for transmit applications," *IEEE Xplore*, EDO Corporation and Dept. of Electrical and Computer Engineering. pp. 53-56, Mar. 6-8, 2006.
White et al.; "A variable negative-inductance integrated circuit at UHF frequencies," Microwave and Wireless Components Letters, IEEE , vol. 22, No. 1, 35-37, Jan. 2012.
White Paper by the Virginia Tech Antenna Group of Wireless @ Virgina Tech "Non-Foster Reactance Matching for Antennas," pp. 1-5 <http://wireless.vt.edu/research/Antennas_Propagation/Whitepapers/Whitepaper-Non-Foster_Reactance_Matching_for_Antennas.pdf>.
White, C.R. and Rebeiz, G.M., "A shallow varactor-tuned cavity-backed-slot antenna with a 1.9:1 tuning range," IEEE Trans. Antennas Propagation, 58(3), 633-639, Mar. 2010.
Office Action dated Jul. 22, 2015 from Chinese Patent Application No. 201280021746.X with brief English summary.
From U.S. Appl. No. 13/910,039 (Unpublished, Non-Publication Requested), Non-Final Rejection mailed on Nov. 25, 2015.
From Chinese Patent Application No. 201280033448.2, PRC Office Action dated Nov. 17, 2015 with Brief English summary.

\* cited by examiner ns and Propagat.", vol. 57, no, 8, August 2009. These non-
OPTICALLY POWERED AND CONTROLLED NON-FOSTER CIRCUIT

CROSS REFERENCE TO RELATED APPLICATIONS

This application is related to the following U.S. patent applications: (i) U.S. patent application Ser. No. 13/441,659," entitled "Wideband Tunable Impedance Surfaces" filed Apr. 4, 2012, (ii) U.S. Provisional Patent Application Ser. No. 61/537,488 entitled "Wideband Tunable Impedance Surfaces", filed Sep. 21, 2011; (iii) U.S. Provisional Patent Application Ser. No. 61/473,076 entitled "Wideband Adaptable Artificial Impedance Surface", filed Apr. 7, 2011; (iv) U.S. Provisional Patent Application Ser. No. 61/505,037 entitled "Differential Negative Impedance Converters and Inverters with Tunable Conversion Ratios" filed Jul. 6, 2011; (v) U.S. patent application Ser. No. 12/768,563 entitled "Non-Foster Impedance Power Amplifier", filed Apr. 27, 2010; and (vi) U.S. patent application Ser. No. 13/441,730 entitled "Differential Negative Impedance Converters and Inverters with Tunable Conversion Ratios", filed Apr. 6, 2012, each of which is hereby incorporated herein by reference.

TECHNICAL FIELD

This disclosure relates to the use of optical sources to provide power and control to Non-Foster Circuits (NFCs). An NFC provides negative inductance, negative capacitance, and/or negative resistance. Non-Foster circuits enable tunable impedance surfaces having improved bandwidths. The term, "tunable impedance surface" is meant to refer to a class of surfaces called Artificial Impedance Surfaces (AISs), Artificial Magnetic Conductors (AMCs) and Frequency Selective Surfaces (FSSs), and this disclosure relates to the use of optical sources to power and control circuits with variable negative inductance in order to provide not only tunability but also a wider bandwidth than known in the prior art. In the tunable impedance surface, the impedance which a wave sees, either a free-space plane wave or an attached surface wave, is variable and has wider bandwidth performance than traditional passive artificial impedance surfaces and prior art passive artificial impedance surfaces loaded with varactors. In particular, this disclosure relates to the use of optical sources to provide power and control for NFCs which provide loading of a traditional passive AIS/AMC/FSS with tunable negative inductors realized with NFC technology.

BACKGROUND

Conformal and hidden antennas are desirable on many mobile platforms for reasons of aerodynamics and styling, among others. Such antennas have been implemented as or on Artificial Impedance Surfaces (AIS) and have been associated with Frequency Selective Surfaces (FSS). AIS can also be referred to as Artificial Magnetic Conductors (AMC), particularly when a separate antenna is disposed on it. AMC, AIS and FSS are all well known in the art and look very similar to each other which means that persons skilled in the art have not always maintained bright lines of distinction between these terms. AMC, AIS and FSS are generically referred to as impedance surfaces and if they are tunable using active circuits (to generate negative capacitance or negative inductance for example) they are referred to as Active Artificial Impedance Surfaces herein.

AIS and AMC tend to have a ground plane which is closely spaced from an array of small, electrically conductive patches. The AIS can serve as an antenna itself whereas an AMC tends to have, in use, a separate antenna disposed on it. Other than the manner of use (and where an antenna is specifically mounted on one), an AIS and a AMC are otherwise basically pretty much identical. The FSS, on the other hand, tends to have no ground plane and therefor it can be opaque (reflective) at certain frequencies and transmissive at other frequencies, much like an optical filter. The FSS looks much like a AMC or an AIS, except that there is typically no ground plane as noted above. All of these devices (AMC, AIS and FSS) operate at RF frequencies and have many applications at UHF and higher frequencies. All of these devices (AMC, AIS and FSS) include two dimensional arrays of metallic patches spaced in a subwavelength periodic grid compared to the RF frequencies at which the devices are designed to operate. The metallic patches come in numerous possible geometric shapes.

At VHF and UHF frequencies, however, many relevant platforms which might use AIS/FSS antenna technology are on the order of one wavelength or less in size, which dictates that the antennas be electrically small. Therefore, the performance is limited by the fundamental bandwidth-efficiency tradeoff given by the Chu limit when passive matching is employed.

A wideband artificial magnetic conductor (AMC), a special case of an AIS, can be realized by loading a passive artificial magnetic conductor structure with NFCs (i.e. negative inductance and negative capacitance) as suggested by D. J. Kern, D. H. Werner and M. J. Wilhelm, "Active Negative Impedance Loaded EBG Structures for the Realization of Ultra-Wideband Artificial Magnetic Conductor", in *Proc. IEEE Antennas and Propagation Society Int. Symp.*, 2003, pp 427-430. Only simulation results were presented in this paper with ideal NFCs; no details are provided of how to realize the stable NFCs needed in such an application.

NFCs (non-foster circuits) are so named because they violate Foster's reactance theorem and overcome these limitations by canceling the antenna or surface immittance over broad bandwidths with negative inductors or negative capacitors. See the article by Kern mentioned above and also S. E. Sussman-Fort and R. M, Rudish, "Non-Foster impedance matching of electrically-small antennas, "*IEEE Trans. Antennas and Propagat.*", vol. 57, no, 8, August 2009. These non-passive reactive elements are synthesized using Negative Impedance Converters (NICs) or Negative Impedance Inverters (NIIs). NICs are feedback circuits that convert a passive capacitor to a negative capacitor while NIIs are feedback circuits which convert a passive capacitor to a negative inductor. It is also possible to use passive inductors to make negative capacitors and negative inductors using these circuits, but since a passive capacitor is easier to make using semiconductor fabrication techniques, it is assumed herein that a passive capacitor is preferably used to generate a negative inductance (using a NII) or a negative capacitance (using a NIC) as needed herein.

The main challenge in realizing NFCs is stability; NICs and NIIs are conditionally stable, and the stability margin typically approaches zero as immittance cancellation becomes more complete. For this reason, few stable demonstrations are reported in the literature at and above VHF frequencies. Sussman-Fort and Rudish noted above and K. Song and R. G. Rojas, "Non-Foster impedance matching of electrically small antennas," *Proc. IEEE Ant. Prop. Int. Symp.*, Jul. 2010 have reported negative-capacitance circuits and measured improvement in the realized gain of electrically small monopole antennas.

A well-known class of AIS consists of printed metallic patterns on an electrically thin, grounded dielectric substrate. They can be used to synthesize narrow-band Artificial Magnetic Conductors (AMC) for the realization of low profile antennas as well as suppress surface waves over a narrow bandwidth. They can be made tunable. See, for example, U.S. Pat. No. 6,538,621 to Sievenpiper et al mentioned above. Furthermore, HRL Laboratories of Malibu, Calif. has shown that they can be used to build directional antennas with arbitrary radiation patterns and direct incident energy around obstacles using conformal surfaces with a holographic patterning technique. See the paper noted above by B. H. Fong, et al. entitled "Scalar and Tensor Holographic Artificial Impedance Surfaces". One issue with the use of NFCs in these arrays is that the power and control wiring to the NFCs can affect the electromagnetic properties of an active AIS system. Furthermore, it can be challenging to run the wires over a distance more than about an inch. Most importantly, this approach does not extend to bulk metamaterials or metasurfaces with no ground plane.

Power to the NFCs can be provided by batteries: S. D. Stearns, "Non-Foster circuits and stability theory," in proceedings, 2011 *IEEE Antennas and Propagation Intl. Symposium*, pp. 1942-1945. However, batteries are large so that integration into smaller areas such as 1 square millimeter is not practical. In addition, batteries are heavy and are not practical in extreme temperatures and in high shock applications. More importantly, a battery powered NFC cannot be controlled remotely, either to turn it on/off or to vary the circuit parameters. Furthermore, it would be undesirable for an operator to control NFCs manually in an array/AIS environment which may have hundreds of NFCs.

In A. Adonin, et al. "Monolith Optoelectronic Integrated Circuit With Built-In Photo-voltaic Supply For Control and Monitoring," 1998 *IEEE International conference on electronics, circuits and systems*, vol. 2, pp. 529-531, a low power IC is powered by an integrated PV cell network. This is a low power digital circuit, not an RF circuit. The goal seems to be that it is powered by ambient light.

Schaffner, James H. and Jones, Dennis C., "Single fiber optical links for simultaneous data and power transmission," U.S. Pat. No. 7,941,022, May 10, 2011 describes how to use double core fiber to send power on one optical wavelength and data on another optical wavelength to a remote receiver. In this invention, the use of single mode double core fiber was necessary because of the long length of fiber needed for the application described in the patent. In the present invention, the fiber length is much shorter and the data rates needed for logic control (in some embodiments) is low enough that the double core, single mode fiber is not needed.

BRIEF DESCRIPTION OF THE INVENTION

This invention is the Optically Powered and Controlled Non-Foster Circuit (OPCNFC) that is electrically floating; i.e., it does not have any electrical/conductive connection to a power supply, ground, or control signal. The Non-Foster Circuit (NFC) generates negative inductance, negative capacitance, and/or negative resistance. The preferred method for generating negative inductance, negative capacitance, and/or negative resistance is using Negative Impedance Converters (NICs) or Negative Impedance Inverters (NIIs) preferably comprising transistor feedback circuits. Alternatively, the NFC may be enabled by diodes or other negative resistance elements.

Whereas state of the art NFCs require conductive (e.g. metallic) connections to a power supply and control lines, the present invention is both powered and controlled using electromagnetic energy, preferably over one or more optical fibers or integrated optical waveguides. One or more light sources at some distance from the NFC generate sufficient power to operate the NFC and transmit it to the NFC preferably over an optical waveguide. The power is then converted to Direct Current (DC) using photovoltaic cells. Preferably, control signals are also transmitted to the NFC over optical waveguides; these signals are used to vary the synthesized negative capacitance, inductance, etc. produced by the NFC.

DETAILED DESCRIPTION

Figure 1C:
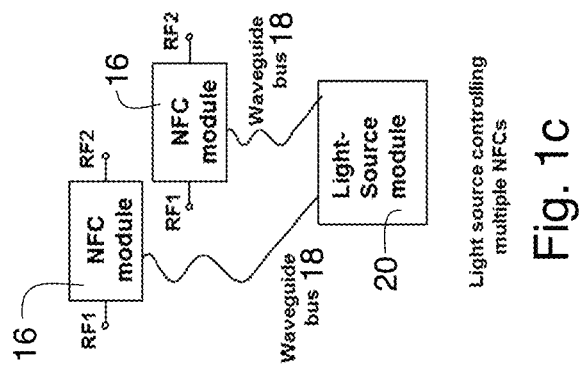
FIG. 1*c* shows a single light source module powering and controlling multiple NFC modules.
Figure 1B:
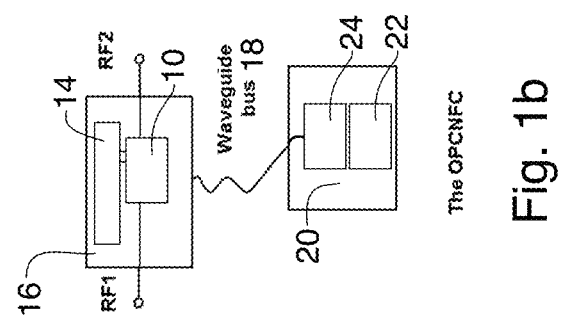
FIG. 1*b* shows a top level schematic of the OPCNFC. The light source module sends both high power and data to the NFC module over the waveguide bus (typically a bundle of optical fibers) to power and control the NFC. RF1 and RF2 represent the two connections to metallic patches on the Active Artificial Impedance Surface.
Figure 1A:
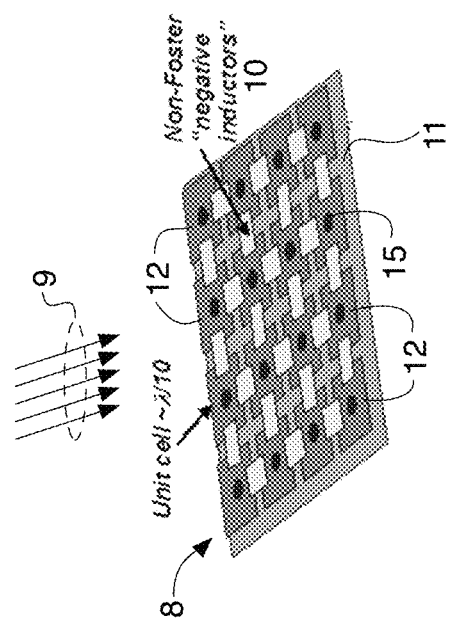
FIG. 1*a* shows an exemplary application of the Optically Powered and Controlled Non-Foster Circuit (OPCNFC) wherein NFCs are connected between metallic patches on a periodic grid on the Active Artificial Impedance Surface.

An exemplary application of OPCNFCs is the Active Artificial Impedance Surface (AAIS) 8 of FIG. 1*a* in which NFCs 10 which are preferably set up to serve as negative inductors (see, for example, FIG. 2) are connected between patches 12 which are arranged in a subwavelength periodic grid (which may have a pitch—or a spacing between centers thereof—equal to about $\lambda/10$ where $\lambda$ is the wavelength of impinging electromagnetic (EM) radiation 9 with which the AAIS is meant to interact). The patches 12 of FIG. 1*a* are depicted as square shaped but those skilled in the art making Artificial Impedance Surfaces know that the patches 12 may assume other geometric shapes (such as triangular shaped patches, hexagonal shaped patches, rectangular shaped patches, etc.). The patches 12 are disposed on a dielectric substrate 11 and are typically (but not necessarily) coupled to a ground plane 13 (disposed on an opposing surfaces of the dielectric substrate 11—see FIG. 1*e*) by a centrally located metallic connection 15 in each (or some) of the patches 12 which connection 15 penetrates and the dielectric substrate 11 and contacts the underlying ground plane 13. The patches 12, dielectric substrate 11 and ground plane 13 (if used) may be formed using printed circuit board technologies.

Preferably, the NFCs 10 are floating, meaning that they have exactly two RF circuit nodes RF1 and RF2 (one of which is connected to one patch 12 and the other of which is connected to a neighboring patch 12) with preferably no additional connections to the ground plane or to any lengthy metallic control lines. This is because any additional metallic control wires or bias lines may will tend to adversely affect the electromagnetic properties of the AAIS 8. For example, it is well known to those of ordinary skill in this art that bias wires that are not perpendicular to the electric field E (see FIG. 1*d*) impinging the AAIS 8 will scatter EM waves 9. One may assert that the NFCs 10 can be biased through the RF nodes, but this not practicable in most cases; first, it is often difficult to realize a potential difference between neighboring patches 12 and, second, attempting to power the NFC 10 itself this way necessitates chokes and DC blocks that may lead to undesirable oscillations.

If $Y_L$ is a pure capacitance, then $Y_{NII}$ is a negative inductance, scaled by $R_1 \cdot R_2$, in parallel with variable resistor $R_4$. This tunability requires that at least one additional voltage be applied to the circuit.

If $Y_L$ is a pure capacitance, then)(NH is a negative inductance, scaled by R1*R2, in parallel with variable resistor R4. This tunability requires that at least one additional voltage be applied to the circuit.

For these reasons, the inventors propose an OPCNFC, an embodiment of which is depicted by FIG. 1*b*, where the NFC 10 thereof is both powered and controlled by optical energy instead of using relatively conventional metallic wires on the AAIS 8 for power and control functionality. The OPCNFC is preferably formed by a module 16 which in this embodiment includes an NFC 10 (preferably of the type shown in FIG. 2, for example) and a photovoltaic (PV) device 14 that converts an received EM wave to DC current at the voltage required to power the NFC 10 preferably mounted on a common substrate 17 (which may be a printed circuit board). Preferably, the OPCNFC module 16 is associated with means to apply control signals to the NFC 10. These optical power and control signals may be coupled through free-space, but preferably are coupled through a waveguide bus 18, which is preferably composed of one or more optical waveguides or optical fibers that connect the OPCNFC module 16 with one or more light-source modules 20. The ground connection shown in FIG. 2 preferably floats with respect to the ground plane 13, but is connected to a ground associated with the photovoltaic device 14. If bus 18 is implemented as an integral waveguide bus then it is preferably embodied as an integrated optical waveguide network disposed on top of or in substrate 11 preferably just below or laterally adjacent the layer defined of the 2D array of patches 12.

The light-source module 20 comprises or connects to a conventional power supply and generates the power and control signals to operate each NFC 10 in each OPCNFC module 16, as well as an interface 22 for a user to control the NFCs 10 in each OPCNFC module 16. One of ordinary skill in the art will appreciate that that this interface 22 may be analog voltages or currents or may be digital (e.g. USB) such that it can be controlled by computer. The light source(s) in light-source module 20 may be, for example, lasers or LEDs. Single mode diode lasers are commercially available that put out 100's of mW into a fiber or other waveguide in bus 18 and solid state lasers are available commercially that can provide a few watts of power into a fiber or other waveguide in bus 18. Thus, assuming no loss in the fibers or other waveguides in bus 18 or in a fiber/waveguide to PV cell 14 interface, if it takes about 30 mW to power a single NFC 10, then a single laser diode can fiber multiplex to about ten NFCs 10 (see FIG. 1*c*), while a solid state laser can fiber multiplex to approximately sixty NFCs. Superluminescent LEDs are another option; an LED could provide up to 30 mW into a fiber and could provide power to a single NFC 10.

Figure 1D:
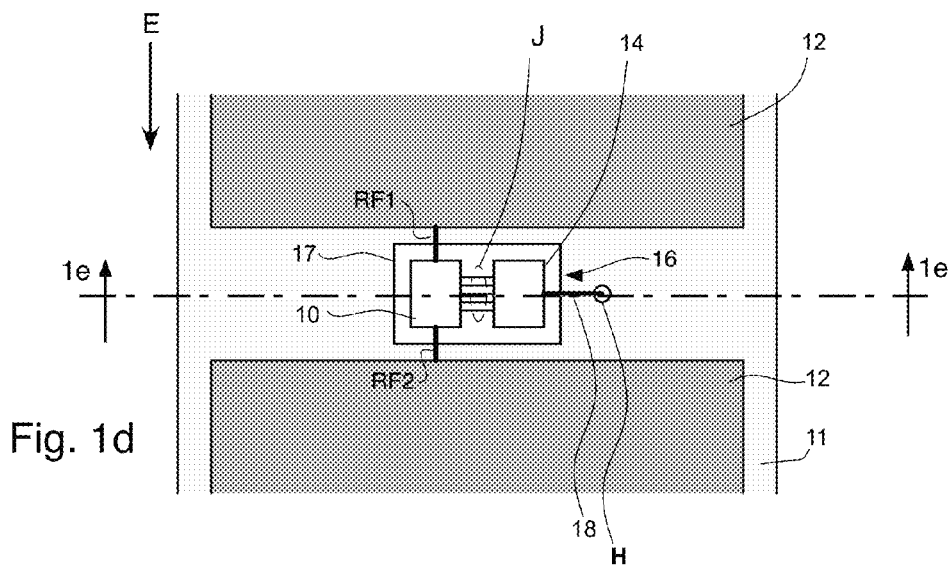
FIG. 1*d* is a plan view of the OPCNFC disposed between two of the metallic patches of shown in FIG. 1*a*, with the connections to the OPCNFC being depicted in greater detail.

FIG. 1*d* is a plan view showing the OPCNFC module 16 disposed between two neighboring patches 12 in greater detail. The NFC 10 thereof has two metallic leads RF1 and RF2 each of which couple to one of the neighboring metallic patches 12 preferably in a direction parallel to the E field as noted by the arrow on FIG. 1*d*.

The OPCNFC module 16 may be implemented as a hybrid circuit where the NFC 10 and optoelectronics 14 may be two or more separate components packaged together on a single printed circuit board (PCB) 17 or other small package or as an optoelectronic integrated circuit (OEIC), where the entire circuit is preferably combined on a single semiconductor die for both the NFC 10 and the optoelectronics 14. If the NFC 10 and the optoelectronics 14 are disposed on separate semiconductor dies then relatively short metallic interconnections J (formed by metallic traces, leads or jumpers) will need to be made between the two dies. Metallic interconnections J are preferably disposed perpendicular to the direction of E field as noted by the arrow. If the NFC 10 and the optoelectronics 14 are disposed on a single semiconductor die then relatively short metallic interconnections J occur on or within the die and a separate substrate 17 may then not be needed, rather the single die bearing the NFC 10 and the optoelectronics 14 then becomes the aforementioned OPCNFC module 16 as is depicted by the embodiment of FIG. 1*f*.

Figure 1E:
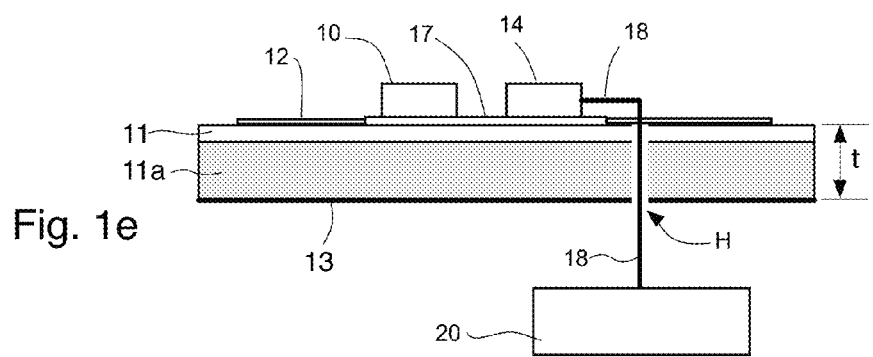
FIG. 1*e* is a side elevational view taken along section line 1*e*-1*e* depicted on FIG. 1*d*.
Figure 1F:
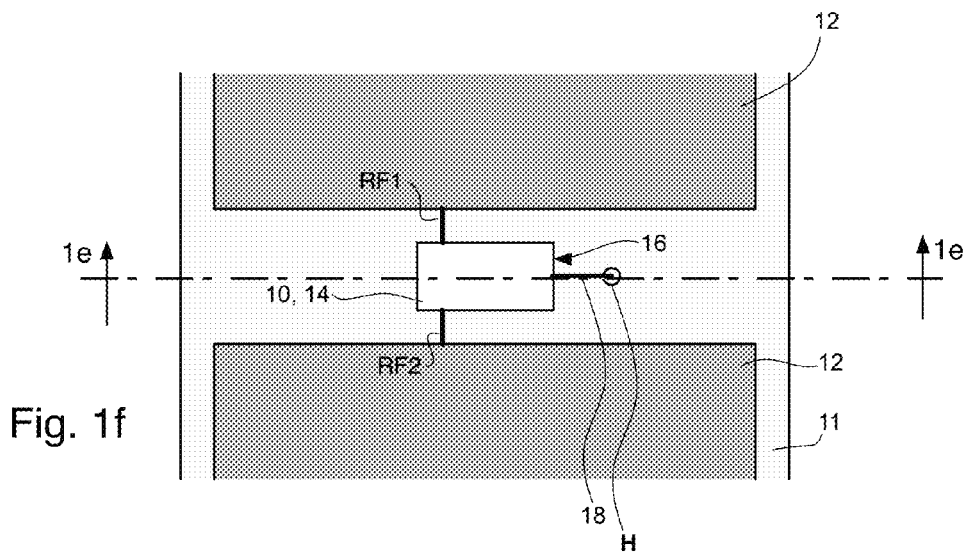
FIG. 1*f* depicts an embodiment with a hybrid OPCNFC.

FIG. 1*e* is a side sectional view taken along line 1*e*-1*e* depicted on FIG. 1*d*. Holes H may be optionally formed through substrate 11 (and through the underlying ground plane 13 if used and layer 11*a* discussed below) adjacent each OPCNFC module 16 (and between neighboring patches 12) as a passage for each fiber of a fiber embodiment of the waveguide bus 18 so that the fibers of bus 18 do not significantly impair interaction between the impinging EM radiation and the AAIS 8. Alternatively the fibers or waveguide(s) 18 may be simply disposed on or over the top surface of the AAIS 8 but in that case then preferably arranged to fall or lie upon (or be affixed to the top surface of the AAIS 8) and preferably between the patches 12 to limit any interference with EM radiation 9 (see FIG. 1*a*). And as noted above the fibers or waveguide(s) 18 may be implemented as an integrated optical waveguide network disposed on top of or in substrate 11 preferably just below or laterally adjacent the layer defined of the 2D array of patches 12.

Dielectric substrate 11 may be formed by a printed circuit board with patches 12 being formed by patterning one metallic surface of such a printed circuit board. The distance t between patches 12 and the ground plane 13 is preferably about $\lambda/40$ where $\lambda$ is the wavelength of impinging EM radiation 9. If the dielectric layer 11 of a printed circuit board (for example) is not sufficiently thick, than an additional layer of dielectric foam (or any other dielectric material including air or even a vacuum) 11a may be employed so that the desired thickness t of all of the dielectric region between the patches 12 and the ground plane 13 is preferably attained.

Several embodiments of the NFC module 16 are shown in FIGS. 3a-3e, where common reference numerals are used to identify common or similar components used in the described embodiments.

Figure 2:
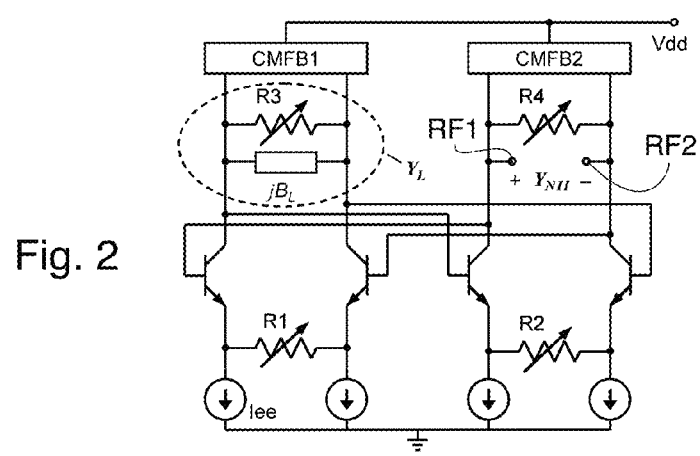
FIG. 2 shows an exemplary NFC.
Figure 3A:
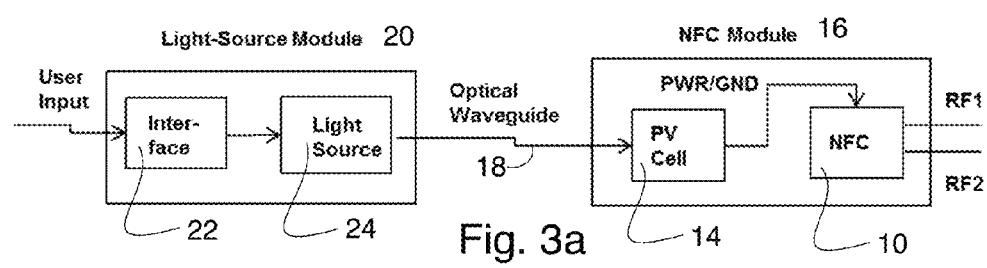
FIG. 3*a* shows an optical module providing power to an NFC module through an optical waveguide.

In the embodiment of FIG. 3a, the NFC 10 is designed such that its parameters are a function of the NFC bias current. An exemplary NFC 10 is depicted by FIG. 2 where the resistors are all fixed and the load is a pure capacitance C. The NFC 10 is then generates a negative inductance given by $Y_{NII}=-K^2/Y_L$ where $K^2=g_m^2/[(2+g_mR_1)(2+g_mR_2)]$ and $g_m$ is the transconductance of the transistors which is directly proportional to the bias current. In this embodiment, the waveguide bus 18 can be a single optical waveguide and the light source is a single source with variable output power. Thus the NFC 10 of FIG. 3a is controlled by the power of light source 24.

Figure 3B:
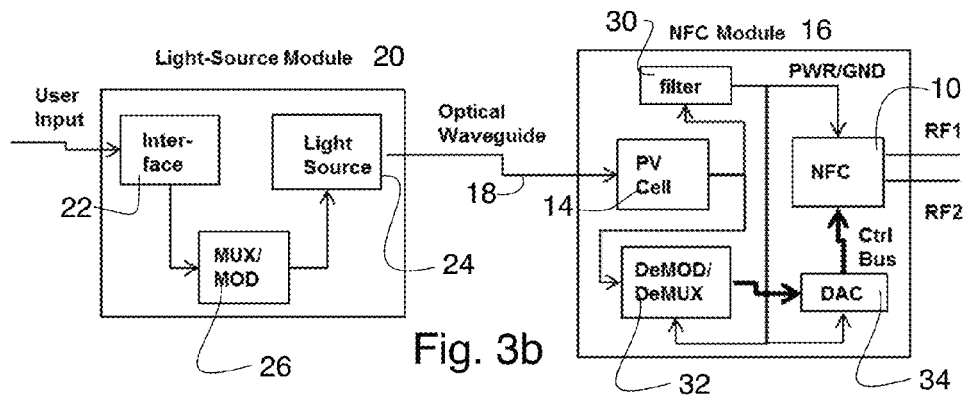
FIG. 3*b* shows an NFC module being provided constant power supply voltage and current. A single light source supplies power through an optical waveguide. The light source is modulated with information to control the NFC.

In the embodiment of FIG. 3b, the NFC 10 has a constant power supply voltage and current and is controlled by separate voltages or currents. A single light source 24 supplies power and is modulated by MUX/MOD 26 with information to control the NFC 10. Control signals for multiple parameters may be multiplexed on the data stream supplied via optical waveguide bus 18. In the NFC module 16 of this embodiment, the modulated signal supplied via the optical waveguide is filtered by a filter 30 to supply power to the NFC 10 and is also sent to a demodulator 32 where it is demultiplexed. Finally, one or more digital to analog converters (DACs) 34 generate the physical control signals applied to NFC 10 to control, for example, R1 and R2.

Figure 3C:
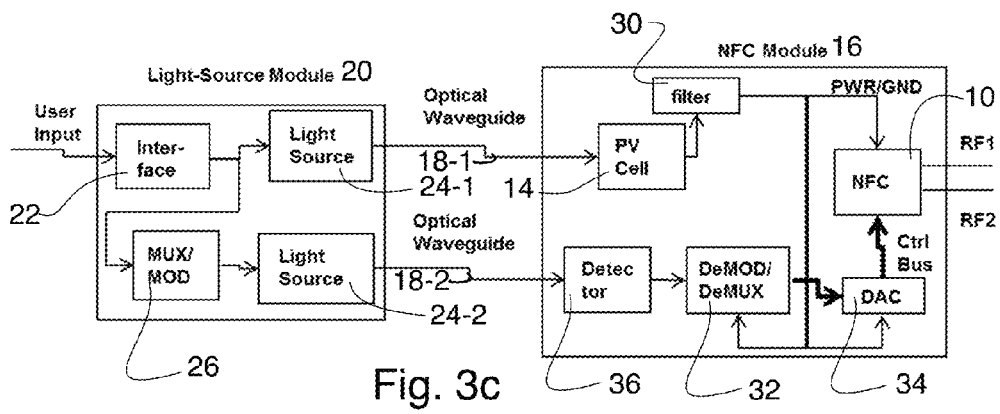
FIG. 3*c* shows an NFC module being provided constant power supply voltage and current from a continuous wave light source and being controlled by a separate modulated light source. Both light sources couple to the NFC module by separate optical waveguides.

In the embodiment of FIG. 3c, the NFC 10 has a constant power supply voltage and current and is controlled by separately generated voltages or currents. A continuous wave light source 24-1 transmits a relatively high power EM wave over a first optical waveguide or fiber 18-1 to power the NFC module 16, which high power EM wave is converted to DC by PV cell 14 and filter 30. A separate light source 24-2 (which may be a low power communications laser or LED) transmits the relatively low power control signals over a separate waveguide or fiber 18-2, which are then detected by detector 36 and demodulated, demultiplexed, and converted into analog control signals by DeMod/DeMUX 32 and DAC 34 for controlling R1 and R2 of the NFC 10 of FIG. 2.

Figure 3D:
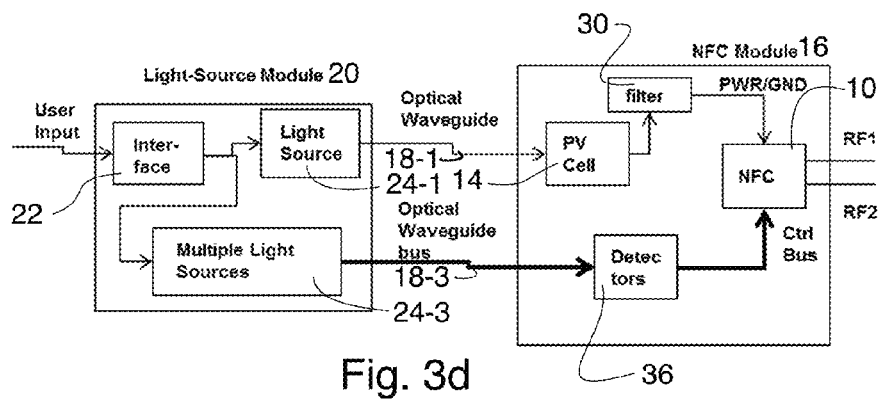
FIG. 3*d* shows an NFC module being provided constant power supply voltage and current from a continuous wave light source and being controlled by a separate modulated light source. Instead of multiplexing the control light, each control signal has its own waveguide in an optical waveguide bus.
Figure 3E:
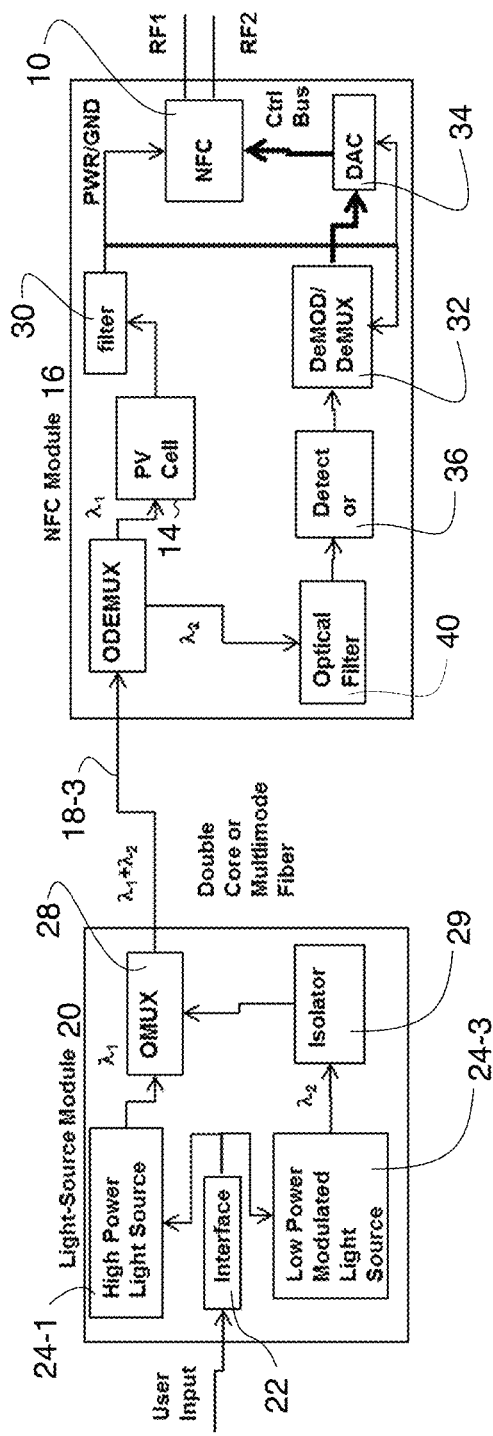
FIG. 3*e* shows an NFC module being provided power from a continuous wave light source and being controlled by a separate intensity modulated light source. The two light sources, at different wavelengths, are multiplexed (MUX) together into a single optical fiber and demultiplexed at the NFC module to provide power and control signal.

The embodiment of FIG. 3d is similar to the architecture of the embodiment of FIG. 3c except that instead of multiplexing the control signals, each control signal has its own waveguide or fiber in bus 18-3, which eliminates the need for a DeMod/DeMUX in module 16 but adds the need for a plurality of relatively low power light sources 24-3 in module 20 and associated detectors 36 in module 16 (one for each desired unique setting of R1 and R2 in the NFC 10 of FIG. 2).

Oftentimes a high power source has no modulation capability. In the embodiment shown in FIG. 3e, two light sources are used, one high power (24-1) and the other low power (24-2) but capable of intensity modulation. Intensity modulations can be achieved by directly modulating a semiconductor laser current or by using an external modulator with a fixed wavelength laser. These two light sources 24-1 and 24-2, at different wavelengths, are multiplexed (MUX) together by an Optical MUX 28 into a single optical fiber 18-3, which can be of a double core design for high data rates, or of a multi-mode design for lower data rates. Data rates using multi-mode fiber range from 10 Mbps to 10 Gbps, depending upon the length of fiber (for example 1 Gbps can be transmitted through 1 km of graded index fiber with little dispersion—John Gower, *Optical Communications Systems*, 2<sup>nd</sup> edition, Prentice Hall, 1993). At the NFC module 16 the high power and data signals are demultiplexed (DEMUX) by an Optical DEMUX 38; the high power signal goes to a PV cell 14 and the data signal goes to a high speed photodetector 36 for demodulation of the control signals. The optical isolator 29 at the source and the optical filter 40 at the NFC Module 16 are optionally used to protect the data laser 24-2 and detector 36 from damage from any high power light that leaks through the OMUX 28 and ODEMUX 38.

This concludes the description including preferred embodiments of the present invention. The foregoing description including preferred embodiments of the invention has been presented for the purposes of illustration and description. It is not intended to be exhaustive or to limit the invention to the precise forms disclosed. Many modifications and variations are possible within the scope of the foregoing teachings. Additional variations of the present invention may be devised without departing from the inventive concept as set forth in the following claims.

What is claimed is:

1. An optically powered and controlled NFC module comprising an NFC, a photovoltaic cell that powers the NFC from electromagnetic waves provided to the NFC module, and a separate means to control the NFC when the NFC is powered on using electromagnetic waves provided to the NFC module.

2. The optically powered and controlled NFC module of claim 1 in combination with at least one waveguide that guides the electromagnetic waves from a light source module to the NFC module.

3. The optically powered and controlled NFC module of claim 2 wherein at least one waveguide comprises a waveguide bus.

4. The optically powered and controlled NFC module of claim 1 wherein a first light source supplies power to the NFC and a second light source provides information to control the NFC.

5. The optically powered and controlled NFC module of claim 4 wherein the second light source comprises a plurality of light sources, one for each possible unique control signal combination and wherein each of the plurality of light sources has an associated separate waveguide.

6. The optically powered and controlled NFC module of claim 1 wherein a single light source supplies power to the NFC and is modulated with information to control the NFC while power is supplied to the NFC to power it.

7. The optically powered and controlled NFC module of claim 1 wherein a first power light source supplies power to the NFC and a plurality of lower power light sources provide information to control the NFCs through an optical waveguide bus.

8. The optically powered and controlled NFC module of claim 1 wherein a light source supplies power to the NFC and a modulated power light source provides information to control the NFCs and where both source EM power and control EM signal are sent through a single optical waveguide.

9. The optically powered and controlled NFC module of claim 1 wherein control signals for multiple parameters may be multiplexed on a data stream, the modulated signal being filtered to supply power to the NFC module and also being sent to a demodulator to generate control signals for the NFC.

10. An optically powered non-Foster Circuit (NFC) module comprising an NFC and a photovoltaic cell that both powers the NFC on and off and also varies parameters of the NFC, when the NFC is powered on, from electromagnetic waves provided to the NFC module.

11. The optically powered NFC module of claim 10 in combination with at least one waveguide that guides the electromagnetic waves from a light source module to the NFC module.

12. The optically powered NFC module of claim 11 wherein the at least one waveguide comprises a waveguide bus.

13. The optically powered NFC module of claim 10 wherein a light source supplies power to the NFC which light source is modulated with information to control the NFC while power is supplied to the NFC to power it.

14. The optically powered NFC module of claim 13 wherein a single light source both supplies power to the NFC and said information to control the NFC while power is supplied to the NFC to power it.

15. The optically powered NFC module of claim 10 wherein the NFC is controlled, while the NFC is powered on, by varying the power of the EM wave.

16. An optically powered Artificial Impedance Surface (AIS) comprising:
  a. a substrate with a two dimensional array of electrically conductive patches disposed thereon;
  b. a plurality of non-Foster Circuits (NFCs) coupled with neighboring patches in said two dimensional array of patches disposed on said substrate;
  c. a plurality of photovoltaic cells coupled to the NFCs, the photovoltaic cells supplying (i) electrical energy to the NFCs and (ii) control signals for controlling said NFCs using modulated electromagnetic energy impinging the AIS or using modulated electromagnetic energy from a light source associated with said optically powered Artificial Impedance Surface (AIS), the electromagnetic energy being modulated with said control signals.

17. The optically powered Artificial Impedance Surface (AIS) of claim 16 wherein electromagnetic energy from said light source is guided from said light source to said plurality of photovoltaic cells via one or more waveguides or optical fibers.

18. The optically powered Artificial Impedance Surface (AIS) of claim 16 wherein said control signals are applied to said plurality of non-Foster Circuits (NFCs) via an optical fiber or waveguide from a control station.

19. The optically powered Artificial Impedance Surface (AIS) of claim 16 wherein control signals for multiple parameters for controlling the NFCs are multiplexed as a modulated data stream, the modulated data stream being filtered to supply power to the NFCs and also being sent to a demodulator to generate control signals for the NFCs.

20. An optically powered and controlled NFC module comprising an NFC, a photovoltaic cell that powers the NFC from electromagnetic waves provided to the NFC module, a separate means to control the NFC using electromagnetic waves provided to the NFC module, wherein a first light source supplies power to the NFC, a second light source provides information to control the NFC and wherein the second light source transmits the control signals over a separate waveguide, and wherein the control signals are then demodulated, demultiplexed, and converted into analog control signals.

* * * * *